United States Patent
Shao et al.

(10) Patent No.: US 10,247,987 B2
(45) Date of Patent: Apr. 2, 2019

(54) PIXEL UNIT, ARRAY SUBSTRATE AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Xibin Shao, Beijing (CN); Dongchuan Chen, Beijing (CN); Yanping Liao, Beijing (CN); Zhenyu Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/541,427

(22) PCT Filed: Sep. 29, 2016

(86) PCT No.: PCT/CN2016/100742
§ 371 (c)(1),
(2) Date: Jul. 3, 2017

(87) PCT Pub. No.: WO2017/128755
PCT Pub. Date: Aug. 3, 2017

(65) Prior Publication Data
US 2018/0107036 A1    Apr. 19, 2018

(30) Foreign Application Priority Data

Jan. 27, 2016 (CN) .......................... 2016 1 0054185

(51) Int. Cl.
*G02F 1/1333* (2006.01)
*G02F 1/1343* (2006.01)
(Continued)

(52) U.S. Cl.
CPC ...... *G02F 1/1343* (2013.01); *G02F 1/133707* (2013.01); *G02F 1/134309* (2013.01);
(Continued)

(58) Field of Classification Search
CPC ............. G02F 1/1343; G02F 1/136286; G02F 1/133707; G02F 1/134309; H01L 27/12; G09G 2300/0439
(Continued)

(56) References Cited

U.S. PATENT DOCUMENTS

2003/0137628 A1   7/2003 Nagaoka
2004/0238823 A1  12/2004 Lee et al.
(Continued)

FOREIGN PATENT DOCUMENTS

CN          1573491 A    2/2005
CN        101398587 A    4/2009
(Continued)

OTHER PUBLICATIONS

Search Report in Chinese Application No. 201610054185.3 dated May 13, 2016, with English translation.
(Continued)

*Primary Examiner* — Charles S Chang
(74) *Attorney, Agent, or Firm* — Womble Bond Dickinson (US) LLP

(57) ABSTRACT

The present disclosure provides a pixel unit, an array substrate and a manufacturing method thereof. The pixel unit comprises slit electrodes and comprises four zones. The slit electrodes in the four zones are electrically connected with each other. The slit incline directions of the slit electrodes of the pixel unit in each of the four zones are the same, and the slit inclined directions of the slit electrodes of the pixel unit in any two adjacent zones of the four zones are different. The pixel unit structure with a plurality of domains and the array (Continued)

substrate comprising the pixel unit structure provided by the present disclosure can eliminate color deviation to the greatest extent, and have excellent light transmittance.

13 Claims, 3 Drawing Sheets

(51) Int. Cl.
*H01L 27/12* (2006.01)
*G02F 1/1362* (2006.01)
*G02F 1/1337* (2006.01)

(52) U.S. Cl.
CPC ........ *G02F 1/136286* (2013.01); *H01L 27/12* (2013.01); *G09G 2300/0439* (2013.01)

(58) Field of Classification Search
USPC .......................................................... 349/144
See application file for complete search history.

(56) References Cited

U.S. PATENT DOCUMENTS

| | | | |
|---|---|---|---|
| 2009/0059152 A1 | 3/2009 | Kamada et al. | |
| 2009/0086149 A1* | 4/2009 | Kim | G02F 1/134363 349/144 |
| 2010/0207862 A1 | 8/2010 | Xu et al. | |
| 2013/0093989 A1 | 4/2013 | Shao et al. | |
| 2015/0109268 A1 | 4/2015 | Huang et al. | |
| 2015/0116622 A1 | 4/2015 | Kim et al. | |

FOREIGN PATENT DOCUMENTS

| | | |
|---|---|---|
| CN | 102388337 A | 3/2012 |
| CN | 102540540 A | 7/2012 |
| CN | 102629047 A | 8/2012 |
| CN | 102955300 A | 3/2013 |
| CN | 103885256 A | 6/2014 |
| CN | 103941490 A | 7/2014 |
| CN | 104570525 A | 4/2015 |
| CN | 105487300 A | 4/2016 |

OTHER PUBLICATIONS

Office Action in Chinese Application No. 201610054185.3 dated Aug. 15, 2017, with English translation.
International Search Report and Written Opinion in PCT/CN2016/100742 dated Dec. 28, 2016, with English translation.
Office Action in Chinese Application No. 201610054185.3 dated Jul. 28, 2016, with English translation.
Office Action in Chinese Application No. 201610054185.3 dated May 2, 2017, with English translation.

* cited by examiner

PIXEL UNIT, ARRAY SUBSTRATE AND MANUFACTURING METHOD THEREOF

The present application is the U.S. national phase entry of PCT/CN2016/100742, with an international filing date of Sep. 29, 2016, which claims the benefit of Chinese Patent Application No. 201610054185.3, filed on Jan. 27, 2016, the entire disclosure of which is incorporated herein by reference.

TECHNICAL FIELD

The present disclosure relates to the display field, particularly to a pixel unit, an array substrate and a manufacturing method thereof.

BACKGROUND

In the prior art, the pixel unit is generally arranged in an area of a minimum unit enclosed by two adjacent gate lines and two adjacent data lines (wherein the gate lines and the data lines intersect). When the slit incline directions of the slit electrodes (e.g., pixel electrodes) in the pixel unit are same, the light transmittance can be increased, but a color deviation under left and right, upper and lower view angles may be caused.

SUMMARY

The technical solution of the present disclosure is proposed with respect to the above problem in the prior art. The present disclosure provides a pixel unit structure with a plurality of domains and an array substrate comprising the pixel unit structure, which can eliminate color deviation to the greatest extent, and have excellent light transmittance.

According to an aspect of the present disclosure, a pixel unit is provided. The pixel unit comprises four zones, and the slit electrodes in the four zones are electrically connected with each other. Slit incline directions of the slit electrodes of the pixel unit in each of the four zones are the same, and slit inclined directions of the slit electrodes of the pixel unit in any two adjacent zones of the four zones are different.

In one embodiment, the pixel unit is located at a cross position of a gate line and a data line, and the four zones of the pixel unit are delimited by a corresponding gate line and data line.

In one embodiment, the slit incline directions of the slit electrodes of the pixel unit in the four zones are in mirror symmetry with respect to the gate and/or the data line.

In one embodiment, an acute angle between the slit incline direction of the slit electrode of the pixel unit and the gate line is in a range of 3°-20°.

In one embodiment, an acute angle between the slit incline direction of the slit electrode of the pixel unit and the data line is in a range of 3°-20°.

In one embodiment, an area enclosed by two adjacent gate lines and two adjacent data lines is a minimum unit, the four zones of the pixel unit are included in four adjacent minimum units respectively, and each minimum unit comprises four zones which belong to four adjacent pixel units respectively.

In one embodiment, slit electrodes in four zones included in a same minimum unit are electrically isolated from each other, and the slit electrodes in four zones included in a same minimum unit have a same slit incline direction.

In one embodiment, opening areas occupied by the four zones are equal.

In one embodiment, the slit electrode is a pixel electrode.

In one embodiment, the pixel unit further comprises a common electrode and a thin film transistor located at a cross point of a gate line and a data line. Specifically, a source of the thin film transistor is electrically connected with the data line, and a drain of the thin film transistor is electrically connected with the slit electrode through a via hole.

In one embodiment, the slit electrode is a common electrode.

The pixel unit according to the present disclosure is arranged at a cross position of the gate line and the data line, and comprises four zones that are delimited by the gate line and the data line and electrically connected with each other. Since the slit incline directions of the slit electrodes of the pixel unit according to the present disclosure in any two adjacent zones are different, the pixel unit according to the present disclosure comprises a plurality of domains in both the up-down direction and the left-right direction. Hence, the pixel unit according to the present disclosure not only improves the color deviation in the up-down direction but also improves the color deviation in the left-right direction. Therefore, the problem of color deviation can be eliminated to the greatest extent.

In addition, since the pixel unit according to the present disclosure is arranged at a cross position of the gate line and the data line, the minimum unit enclosed by two adjacent gate lines and two adjacent data lines can comprise four zones which belong to four adjacent pixel units respectively. The slit electrodes in the four zones included in the same minimum unit are arranged to have the same slit incline direction. Hence, the orientations of the liquid crystals in the same minimum unit are the same, thereby providing excellent light transmittance.

According to another aspect of the present disclosure, an array substrate is provided. The array substrate comprises a plurality of gate lines and a plurality of data lines in cross arrangement, as well as a plurality of pixel units arranged at cross positions of the gate lines and the data lines. Each pixel unit comprises slit electrodes, and each pixel unit comprises four zones delimited by the gate line and the data line. The slit electrodes in the four zones are electrically connected with each other. Slit incline directions of the slit electrodes of each pixel unit in each of the four zones are the same, and slit incline directions of the slit electrodes of each pixel unit in any two adjacent zones of the four zones are different.

In one embodiment, an area enclosed by two adjacent gate lines and two adjacent data lines is a minimum unit, the four zones of the pixel unit are included in four adjacent minimum units respectively, and each minimum unit comprises four zones which belong to four adjacent pixel units respectively.

In one embodiment, slit electrodes in four zones included in a same minimum unit are electrically isolated from each other, and the slit electrodes in four zones included in a same minimum unit have a same slit incline direction.

In one embodiment, opening areas occupied by the four zones are equal.

In one embodiment, the slit electrode is a pixel electrode.

The array substrate according to the present disclosure comprises a plurality of gate lines and a plurality of data lines in cross arrangement, as well as a plurality of pixel units arranged at cross positions of the gate lines and the data lines. Since each pixel unit of the array substrate comprises four zones that are delimited by the gate line and the data line and electrically connected with each other, the pixel unit comprises two domains in the up-down direction, and comprises two domains in the left-right direction. Hence, the array substrate on the whole not only improves the color deviation in the up-down direction, but also improves the color deviation in the left-right direction. Therefore, the problem of color deviation is eliminated to the greatest extent.

The slit electrodes in the four zones included in each of the minimum units of the array substrate are arranged to have a same slit incline direction, such that the orientations of the liquid crystals in the same minimum unit are the same, thereby enabling the array substrate to provide excellent light transmittance on the whole.

According to another aspect of the present disclosure, a method of manufacturing an array substrate is provided. The method of manufacturing an array substrate comprises steps of: forming a plurality of gate lines and a plurality of data lines in cross arrangement; and arranging a plurality of pixel units at cross positions of the gate lines and the data lines. Each pixel unit comprises slit electrodes, and each pixel unit comprises four zones delimited by the gate line and the data line. The slit electrodes in the four zones are electrically connected with each other. Slit incline directions of the slit electrodes of each pixel unit in each of the four zones are the same, and slit inclined directions of the slit electrodes of each pixel unit in any two adjacent zones of the four zones are different.

In one embodiment, an area enclosed by two adjacent gate lines and two adjacent data lines is a minimum unit, the four zones of the pixel unit are included in four adjacent minimum units respectively, and each minimum unit comprises four zones which belong to four adjacent pixel units respectively.

In one embodiment, slit electrodes in four zones included in a same minimum unit are electrically isolated from each other, and the slit electrodes in four zones included in a same minimum unit have a same slit incline direction.

In one embodiment, opening areas occupied by the four zones are equal.

BRIEF DESCRIPTION OF THE DRAWINGS

The above and other characteristics and advantages of the present disclosure will be understood more clearly through the following detailed description with reference to the drawings, wherein.

DETAILED DESCRIPTION

Figure 1:
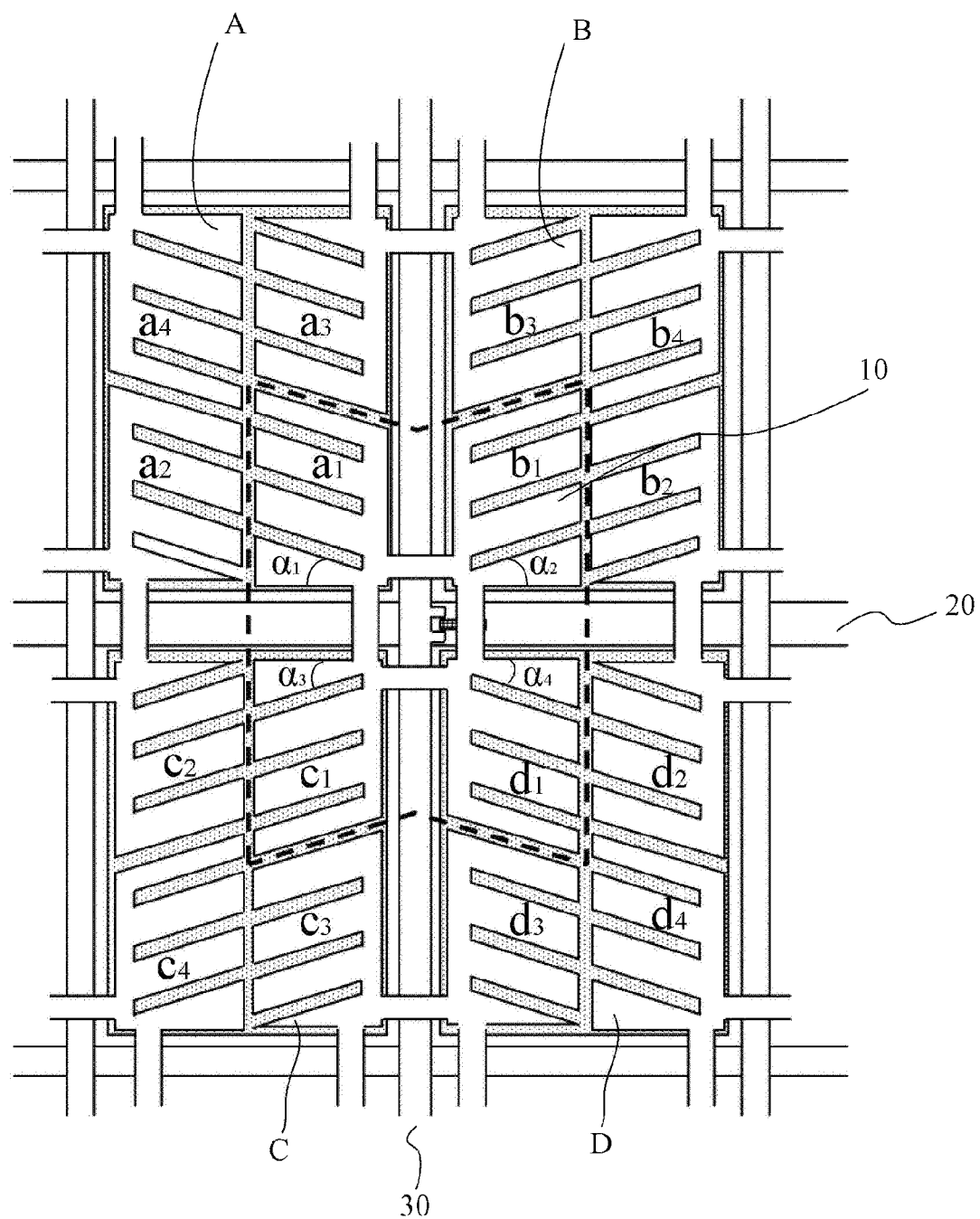
FIG. 1 is a schematic structural view of a pixel unit according to an embodiment of the present disclosure.

Hereinafter, exemplary embodiments of the concept of the present disclosure will be described in detail with reference to the drawings.

However, the concept of the present disclosure can be illustrated in many different forms, and should not be understood as being limited to the particular embodiments expounded in this text. In addition, these embodiments are provided in order to enable this disclosure to be thorough and complete, and to communicate the scope of the concept of the present disclosure to the skilled person in the art completely.

For the sake of clarity, shapes and sizes of the elements can be shown exaggeratedly in the drawings. Moreover, the same reference sign will be used for indicating the same or similar elements throughout.

For the convenience of description, the spatial relative terms such as "under", "above", "at the left side of", "at the right side of" can be used in this text, so as to describe the relationship between one element or feature and another (the other) element(s) or feature(s) as shown in the drawings. It should be understood that the spatial relative terms are aimed at covering different orientations of the devices in use or in operation in addition to the orientations as shown in the drawings. For example, if the devices in the drawings are put upside down, the element that is described as "under other elements or features" will be orientated to be "above other elements or features". In this way, the exemplary term "under" can cover two orientations: "under" and "above". Devices can be oriented in other ways (rotated by 90 degrees or located at other orientations), and the spatial relative terms used in this text will make corresponding explanations.

FIG. 1 is a schematic structural view of a pixel unit according to an embodiment of the present disclosure.

As shown in FIG. 1, the pixel unit 10 (a part enclosed by a dotted line in FIG. 1) is located at a cross position of a gate line 20 and a data line 30. The pixel unit 10 comprises four zones a1, b1, c1 and d1 delimited by the gate line 20 and the data line 30. The slit electrodes in the four zones a1, b1, c1 and d1 are electrically connected with each other. The slit incline directions of the slit electrodes of the pixel unit 10 in any two adjacent zones are different. For example, as shown in FIG. 1, the zone a1 and the zone b1 are two adjacent zones. The slit incline direction of the slit electrode of the pixel unit 10 in the zone a1 differs from the slit incline direction of the slit electrode in the zone b1. In a similar way, the zone a1 and the zone c1 are two adjacent zones. The lit incline direction of the slit electrode of the pixel unit 10 in the zone a1 differs from the slit incline direction of the slit electrode in the zone c1.

The pixel unit 10 is arranged at a cross position of the gate line 20 and the data line 30, and comprises four zones a1, b1, c1 and d1 that are delimited by the gate line 20 and the data line 30 and electrically connected with each other. Since the slit incline directions of the slit electrodes of the pixel unit 10 in any two adjacent zones are different, the pixel unit 10 comprises a plurality of domains in both the up-down direction and the left-right direction. That is to say, the four zones a1, b1, c1 and d1 of the pixel unit 10 are formed into four domains. The pixel unit 10 comprises two domains in the up-down direction and two domains in the left-right direction. Hence, the pixel unit 10 not only improves the color deviation in the up-down direction but also improves the color deviation in the left-right direction. Therefore, the problem of color deviation is eliminated to the greatest extent.

As shown in FIG. 1, the acute angles between the slit incline directions of the slit electrodes of the pixel unit 10 in the four zones a1, b1, c1 and d1 and the gate line 20 are $\alpha 1$, $\alpha 2$, $\alpha 3$ and $\alpha 4$ respectively. The slit incline directions of the slit electrodes of the pixel unit 10 in the four zones can be in mirror symmetry with respect to the gate line 20, i.e., $\alpha 1 = \alpha 3$ and $\alpha 2 = \alpha 4$. In addition, the slit incline directions of the slit electrodes of the pixel unit in the four zones can be in mirror symmetry with respect to the data line 30, i.e., $\alpha 1 = \alpha 2$ and $\alpha 3 = \alpha 4$. Moreover, the slit incline directions of the slit electrodes of the pixel unit 10 in the four zones can be in mirror symmetric with respect to both the gate line 20 and the data line 30, i.e., $\alpha1=\alpha2=\alpha3=\alpha4$.

The slit incline directions of the slit electrodes of the pixel unit 10 in the four zones a1, b1, c1 and d1 are in mirror symmetry with respect to the gate line 20 and/or the data line 30, such that the liquid crystal molecules in the pixel unit 10 have uniform stress.

According to an embodiment of the present disclosure, the acute angles $\alpha1$, $\alpha2$, $\alpha3$ and $\alpha4$ between the slit incline directions of the slit electrode of the pixel unit 10 in the four zones a1, b1, c1 and d1 and the gate line 20 can be in a range of 3-20 degrees. Alternatively, the acute angles between the slit incline directions of the slit electrode of the pixel unit 10 in the four zones a1, b1, c1 and d1 and the data line 30 can be in a range of 3-20 degrees.

As shown in FIG. 1, the four zones a1, b1, c1 and d1 of the pixel unit are included in four adjacent minimum units A, B, C and D respectively. Each minimum unit comprises four zones which belong to four adjacent pixel units respectively. Specifically, the zone a1 of the pixel unit 10 is included in the minimum unit A, while the minimum unit A further includes three zones a2, a3 and a4 which belong to the other three pixel units respectively. The zone b1 of the pixel unit 10 is included in the minimum unit B, while the minimum unit B further includes three zones b2, b3 and b4 which belong to the other three pixel unit respectively. The zone c1 of the pixel unit 10 is included in the minimum unit C, while the minimum unit C further includes three zones c2, c3 and c4 which belong to the other three pixel units respectively. The zone d1 of the pixel unit 10 is included in the minimum unit D1, while the minimum unit D further includes three zones d2, d3 and d4 which belong to the other three pixel units respectively.

As shown in FIG. 1, the slit electrodes in the four zones included in the same minimum unit are electrically isolated from each other, and the slit electrodes in the four zones included in the same minimum unit have the same slit incline direction. Specifically, for example, the slit electrodes in the four zones a1, a2, a3 and a4 included in the minimum unit A are electrically isolated from each other, because the four zones a1, a2, a3 and a4 belong to four adjacent pixel units respectively. In addition, the slit electrodes in the four zones a1, a2, a3 and a4 have the same slit incline direction, thereby enabling the slit electrodes in the minimum unit A to have the same slit incline direction.

The slit electrodes in the four zones included in the same minimum unit are arranged to have the same slit incline direction, such that the orientations of the liquid crystals in the same minimum unit are the same, thereby providing excellent light transmittance.

The opening areas occupied by the four zones a1, b1, c1 and d1 of the pixel unit 10 can be equal. In addition, the opening areas of the four zones included in each minimum unit can also be equal. For example, the opening areas of the four zones a1, a2, a3 and a4 included in the minimum unit A are equal.

With respect to the advanced super dimension switch (ADS) display mode, the slit electrode can be a pixel electrode. The pixel unit 10 further comprises a common electrode and a thin film transistor located at a cross point of the gate line 20 and the data line 30. The source of the thin film transistor is electrically connected with the data line 30, and the drain of the thin film transistor is electrically connected with the slit electrode through a via hole.

Alternatively, the slit electrode can also be a common electrode. It is directed at the HADS display mode when the slit electrode is a common electrode. Because the common electrode is manufactured in one layer and is connected to the same common electrode signal, connection between the zones is not required. By dividing the plate pixel electrode into zones in the preceding way, the problem of color deviation is eliminated to the greatest extent.

An insulating layer is arranged between the pixel electrode and the corresponding common electrode, and the pixel electrode is arranged above or under the corresponding common electrode.

Figure 2:
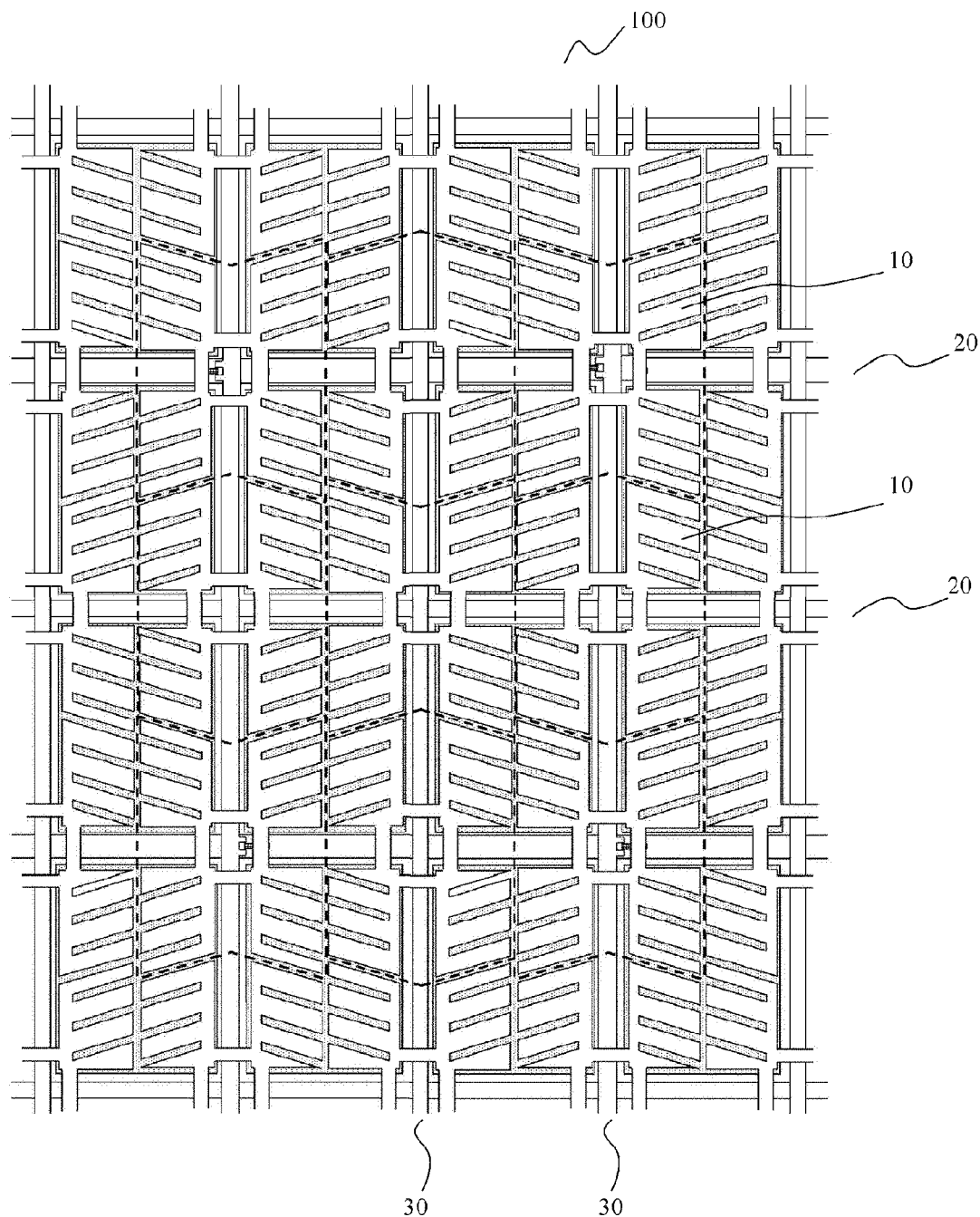
FIG. 2 is a schematic structural view of an array substrate according to an embodiment of the present disclosure.

FIG. 2 is a schematic structural view of an array substrate according to an embodiment of the present disclosure.

As shown in FIG. 2, the array substrate 100 comprises a plurality of gate lines 20 and a plurality of data lines 30 in cross arrangement, as well as a plurality of pixel units 10 arranged at cross positions of the gate lines 20 and the data lines 30. Each pixel unit 10 comprises four zones a1, b1, c1 and d1 delimited by the gate line 20 and the data line 30. The slit electrodes in the four zones a1, b1, c1 and d1 are electrically connected with each other. Slit incline directions of the slit electrodes of each pixel unit 10 in any two adjacent zones of the four zones are different.

According to an embodiment of the present disclosure, an area enclosed by two adjacent gate lines 20 and two adjacent data lines 30 on the array substrate 100 is a minimum unit. The four zones a1, b1, c1 and d1 of each pixel unit 10 of the array substrate 100 can be included in four adjacent minimum units A, B, C and D1 respectively. Each minimum unit can comprise four zones which belong to four adjacent pixel units respectively.

According to an embodiment of the present disclosure, the slit electrodes in four zones included in the same minimum unit are electrically isolated from each other, and the slit electrodes in four zones included in the same minimum unit have the same slit incline direction.

According to an embodiment of the present disclosure, the opening areas occupied by the four zones a1, b1, c1 and d1 of the pixel unit 10 are equal. Therefore, the opening areas occupied by all zones formed on the array substrate 100 are equal.

As shown in FIG. 2, the slit electrode according to the present disclosure can have a slit in an open form or in a closed form.

The array substrate 100 comprises a plurality of gate lines 20 and a plurality of data lines 30 in cross arrangement, as well as a plurality of pixel units 10 arranged at cross positions of the gate lines 20 and the data lines 30. Since each pixel unit 10 of the array substrate 100 comprises four zones a1, b1, c1 and d1 that are delimited by the gate line 20 and the data line 30 and electrically connected with each other, the pixel unit 10 comprises two domains in the up-down direction and two domains in the left-right direction. Hence, the array substrate 100 on the whole not only improves the color deviation in the up-down direction but also improves the color deviation in the left-right direction. Therefore, the problem of color deviation is eliminated to the greatest extent.

The slit electrodes in the four zones included in each of the minimum units of the array substrate 100 are arranged to have the same slit incline direction, such that the orientations of the liquid crystals in the same minimum unit are the same, thereby enabling the array substrate 100 to provide excellent light transmittance on the whole.

Figure 3:
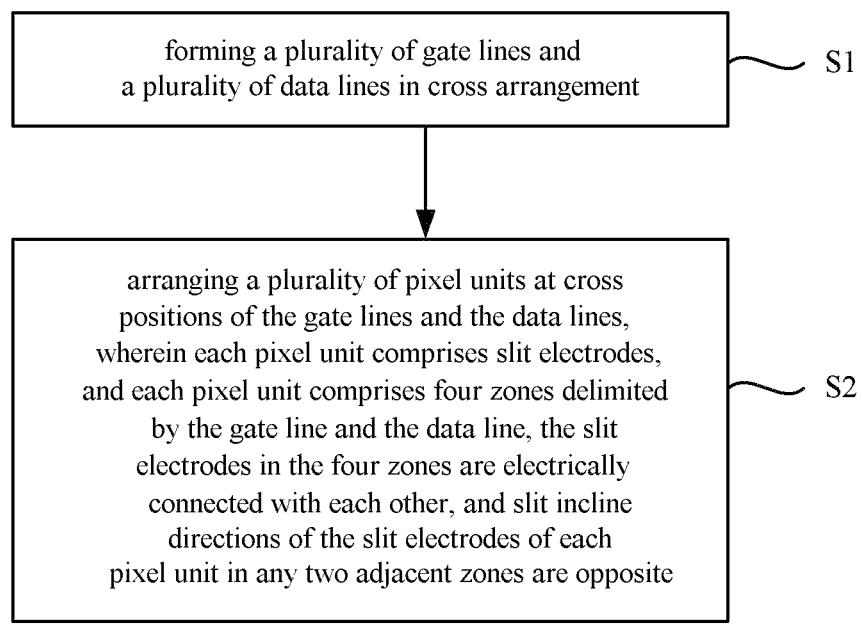
FIG. 3 schematically shows a flow chart of a method of manufacturing an array substrate according to an embodiment of the present disclosure.

FIG. 3 schematically shows a flow chart of a method of manufacturing an array substrate according to an embodiment of the present disclosure.

As shown in FIG. 3, the method of manufacturing an array substrate according to the present disclosure comprises steps of: S1, forming a plurality of gate lines and a plurality of data lines in cross arrangement; and S2, arranging a plurality of pixel units at cross positions of the gate lines and the data lines. Further, each pixel unit comprises slit electrodes, and each pixel unit comprises four zones delimited by the gate line and the data line, the slit electrodes in the four zones being electrically connected with each other. Besides, slit incline directions of the slit electrodes of each pixel unit in any two adjacent zones are different.

According to an embodiment of the present disclosure, an area enclosed by two adjacent gate lines and two adjacent data lines formed on the array substrate is a minimum unit. The sour zones of the pixel unit can be included in four adjacent minimum units respectively, and each minimum unit can comprise four zones which belong to four adjacent pixel units respectively. In addition, the slit electrodes in the four zones included in the same minimum unit can be electrically isolated from each other, and the slit electrodes in the four zones included in the same minimum unit can have the same slit incline direction. The opening areas occupied by the four zones of the pixel unit can be equal.

By the method of manufacturing an array substrate according to the present disclosure, the pixel units are arranged at cross positions of the gate lines and the data lines, such that each pixel unit comprises four zones delimited by the gate line and the data line. Since each pixel unit comprises four zones that are divided by the gate line and the data line and electrically connected with each other, the pixel unit comprises two domains in the up-down direction and two domains in the left-right direction. Hence, it not only improves the color deviation in the up-down direction, but also improves the color deviation in the left-right direction. Therefore, the problem of color deviation is eliminated to the greatest extent.

The slit electrodes in the four zones included in the same minimum unit are arranged to have the same slit incline direction, such that the orientations of the liquid crystals in the same minimum unit are the same, thereby providing excellent light transmittance.

Although the embodiments according to the present disclosure have been illustrated and explained, the ordinary skilled person in the art should understand that various modifications can be made to these exemplary embodiments in forms and details without departing from the spirit and the scope of the concept of the present disclosure defined by the claims attached.

The invention claimed is:

1. A pixel unit, comprising slit electrodes and four zones, the slit electrodes in the four zones being electrically connected with each other, wherein
   slit incline directions of the slit electrodes of the pixel unit in each of the four zones are the same, and
   slit incline directions of the slit electrodes of the pixel unit in any two adjacent zones of the four zones are different,
   wherein the pixel unit is located at a cross position of a gate line and a data line, and the four zones of the pixel unit are delimited by a corresponding gate line and data line,
   wherein an area enclosed by two adjacent gate lines and two adjacent data lines is a minimum unit, the four zones of the pixel unit are included in four adjacent minimum units respectively, and each minimum unit comprises four zones which belong to four adjacent pixel units respectively, and
   wherein slit electrodes in four zones included in a same minimum unit are electrically isolated from each other, and the slit electrodes in four zones included in a same minimum unit have a same slit incline direction.

2. The pixel unit according to claim 1, wherein slit incline directions of the slit electrodes of the pixel unit in the four zones are in mirror symmetry with respect to the gate and/or the data line.

3. The pixel unit according to claim 1, wherein an acute angle between the slit incline direction of the slit electrode of the pixel unit and the gate line is in a range of 3°-20°.

4. The pixel unit according to claim 1, wherein an acute angle between the slit incline direction of the slit electrode of the pixel unit and the data line is in a range of 3°-20°.

5. The pixel unit according to claim 1, wherein opening areas occupied by the four zones are equal.

6. The pixel unit according to claim 1, wherein the slit electrode is a pixel electrode.

7. The pixel unit according to claim 6, wherein:
   the pixel unit further comprises a common electrode and a thin film transistor located at a cross point of a gate line and a data line, wherein
   a source of the thin film transistor is electrically connected with the data line, and a drain of the thin film transistor is electrically connected with the slit electrode through a via hole.

8. The pixel unit according to claim 1, wherein the slit electrode is a common electrode.

9. An array substrate, comprising:
   a plurality of gate lines and a plurality of data lines in cross arrangement, and
   a plurality of pixel units arranged at cross positions of the gate lines and the data lines, wherein
   each pixel unit comprises slit electrodes, and each pixel unit comprises four zones delimited by the gate line and the data line, the slit electrodes in the four zones being electrically connected with each other, and
   slit incline directions of the slit electrodes of each pixel unit in each of the four zones are the same, and slit incline directions of the slit electrodes of each pixel unit in any two adjacent zones of the four zones are different,
   wherein an area enclosed by two adjacent gate lines and two adjacent data lines is a minimum unit, the four zones of the pixel unit are included in four adjacent minimum units respectively, and each minimum unit comprises four zones which belong to four adjacent pixel units respectively, and
   wherein slit electrodes in four zones included in a same minimum unit are electrically isolated from each other, and the slit electrodes in four zones included in a same minimum unit have a same slit incline direction.

10. The array substrate according to claim 9, wherein opening areas occupied by the four zones are equal.

11. The array substrate according to claim 9, wherein the slit electrode is a pixel electrode.

12. A method of manufacturing an array substrate, comprising steps of:
   forming a plurality of gate lines and a plurality of data lines in cross arrangement; and
   arranging a plurality of pixel units at cross positions of the gate lines and the data lines, wherein each pixel unit comprises slit electrodes, and each pixel unit comprises four zones delimited by the gate line and the data line, the slit electrodes in the four zones being electrically connected with each other, wherein
   slit incline directions of the slit electrodes of each pixel unit in each of the four zones are the same, and slit inclined directions of the slit electrodes of each pixel unit in any two adjacent zones of the four zones are different, wherein an area enclosed by two adjacent gate lines and two adjacent data lines is a minimum unit, the four zones of the pixel unit are included in four adjacent minimum units respectively, and each minimum unit comprises four zones which belong to four adjacent pixel units respectively, and wherein slit electrodes in four zones included in a same minimum unit are electrically isolated from each other, and the slit electrodes in four zones included in a same minimum unit have a same slit incline direction.

13. The method according to claim 12, wherein opening areas occupied by the four zones are equal.

* * * * *